(12) United States Patent
Ichikawa

(10) Patent No.: US 6,532,357 B1
(45) Date of Patent: *Mar. 11, 2003

(54) RADIO COMMUNICATION DEVICE AND TRANSMISSION POWER CONTROL METHOD FOR RADIO COMMUNICATION DEVICE

(75) Inventor: Yasufumi Ichikawa, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/340,309

(22) Filed: Jun. 28, 1999

(30) Foreign Application Priority Data

Aug. 7, 1999 (JP) .......................................... 10-224530

(51) Int. Cl.[7] .............................. H04B 1/04; H03G 3/20
(52) U.S. Cl. ...................... 455/126; 455/115; 455/522; 455/69; 455/127; 330/129; 330/151; 330/51; 330/150
(58) Field of Search .......................... 455/522, 69, 67.1, 455/68, 127, 574, 232.1, 115, 126, 253.2, 293, 234.1; 330/151, 51, 127, 129, 135, 150, 310

(56) References Cited

U.S. PATENT DOCUMENTS

| | | | | |
|---|---|---|---|---|
| 5,530,923 A | * | 6/1996 | Heinonen et al. ............ 455/126 |
| 5,548,616 A | * | 8/1996 | Mucke et al. ................ 330/129 |
| 5,561,395 A | | 10/1996 | Melton et al. ................. 330/2 |
| 5,589,796 A | * | 12/1996 | Alberth, Jr. et al. ......... 455/127 |
| 5,604,766 A | * | 2/1997 | Dohi et al. .................... 455/69 |
| 5,623,486 A | * | 4/1997 | Dohi et al. .................... 455/69 |
| 5,646,577 A | | 7/1997 | Ishikura ....................... 330/279 |
| 5,661,434 A | * | 8/1997 | Brozovich et al. ............ 330/51 |
| 5,752,171 A | * | 5/1998 | Akiya ......................... 455/126 |
| 5,758,269 A | * | 5/1998 | Wu .............................. 455/127 |
| 5,831,477 A | * | 11/1998 | Tsumura ....................... 330/51 |
| 5,852,770 A | * | 12/1998 | Kasamatsu ................. 455/126 |
| 5,862,460 A | * | 1/1999 | Rich ........................... 455/116 |
| 5,903,193 A | * | 5/1999 | Adachi ........................ 330/279 |
| 5,909,643 A | * | 6/1999 | Aihara ........................ 455/127 |
| 6,081,701 A | * | 6/2000 | Norimatsu ............... 455/232.1 |

(List continued on next page.)

FOREIGN PATENT DOCUMENTS

| | | | |
|---|---|---|---|
| EP | 0 639 890 | 2/1995 | ............ H03G/3/30 |
| EP | 0 675 605 | 10/1995 | ............ H04B/1/40 |
| EP | 0 883 250 | 12/1998 | ............ H04B/1/04 |
| GB | 2 301 242 | 11/1996 | ............ H03G/3/20 |
| GB | 2 301 247 | 11/1996 | ............ H03F/1/32 |
| GB | 2 317 283 | 3/1998 | ............ H03G/3/20 |
| WO | 99/25064 | 5/1999 | ............ H03G/3/30 |

OTHER PUBLICATIONS

WO 99/31799, Power Saving Device for Radio Communication Terminal, Jun. 24, 1999.

Primary Examiner—William Trost
Assistant Examiner—Rafael Perez-Gutierrez
(74) Attorney, Agent, or Firm—Pearne & Gordon LLP

(57) ABSTRACT

A radio communication device has a first variable power amplifier 19 and a second variable power amplifier 20 and performs gain control of the variable power amplifiers 19 and 20 by a variable power amplifier control section 27 for controlling transmission power of the radio communication device. At this time, the variable power amplifiers 19 and 20 are switched on and off under the control of a switch control section 25 in response to the theoretical value of transmission power updated based on the transmission power of the radio communication device detected by a transmission power detection section 24 or a transmission power control bit extracted by a base band signal processing section 16 for prolonging the time period over which the variable power amplifier 19 or 20 is off.

14 Claims, 8 Drawing Sheets

U.S. PATENT DOCUMENTS 6,118,989 A * 9/2000 Abe et al. .................... 455/127
6,137,354 A * 10/2000 Dacus et al. ................. 330/151
6,185,431 B1 * 2/2001 Li et al. ...................... 455/522
6,208,846 B1 * 3/2001 Chen et al. ................. 455/127
6,212,399 B1 * 4/2001 Kumar et al. ................ 455/522
6,215,987 B1 * 4/2001 Fujita ......................... 455/127
6,438,387 B1 * 8/2002 Ichikawa .................... 455/126
2001/0034217 A1 * 10/2001 Loke et al. ................. 455/126

* cited by examiner

RADIO COMMUNICATION DEVICE AND TRANSMISSION POWER CONTROL METHOD FOR RADIO COMMUNICATION DEVICE

BACKGROUND OF THE INVENTION

This invention relates to a radio communication device for use with a mobile communication equipment for carrying out mobile communication such as a portable telephone and a transmission power control method in the radio communication device.

A mobile communication equipment such as a portable telephone generally used is equipped with a function of controlling its own transmission power in response to the distance between a base station and the mobile station when information is transmitted. In a communication system of multiple access type for multiplexing communication channels, transmission power control for fixing power of signals arriving at the base station is absolutely necessary to reduce interference between the communication channels and improve frequency use efficiency.

Particularly with mobile communication equipment adopting a CDMA (code division multiple access) system using spread spectrum modulation techniques, a number of users share a single frequency band, thus the possibility is high that a so-called far and near problem in which a signal having large power masks a signal having small power will occur, and a problem occurs in which a signal of any other station degrades the line quality of the home station as an interference wave. To solve this problem, hitherto, various transmission power control techniques have been examined; particularly, a transmission power control system with a closed loop is known as a transmission power control system for responding to an interference signal changing instantaneously. In the CDMA system, highly linear transmission power control in a wide range (for example, 70 to 80 dB) is required. Further, in a wide-band CDMA (W-CDMA) system being examined at present as a next-generation mobile communication system, accuracy requirement of transmission power at the large power time is high and transmission power control of higher accuracy is required.

FIG. 8 is a flowchart to show an example of a transmission power control method in a related art with a closed loop. For a base station and a mobile station to communicate with each other, the mobile station determines a transmission power control bit based on the reception power of a reception wave (desired wave) from the base station at step S101, inserts the transmission power control bit into a transmission signal, and transmits the resultant signal to the base station. The base station receives the signal transmitted from the mobile station, extracts the transmission power control bit from the reception signal at step S105, and controls a variable power amplifier in the base station as indicated in the transmission power control bit at step S106.

Likewise, the base station determines a transmission power control bit based on reception power of the reception wave from the mobile station at step S104, inserts the transmission power control bit into a transmission signal, and transmits the resultant signal to the mobile station. The mobile station receives the signal transmitted from the base station, extracts the transmission power control bit from the reception signal at step S102, and controls a variable power amplifier in the mobile station as indicated in the transmission power control bit at step S103.

Such transmission power control is performed, thereby making it possible to hold reception power almost constant at the base and mobile stations regardless of where the mobile station is located.

To perform transmission power control of high accuracy by the transmission power control method in the related art as described above, variable power amplifiers of high accuracy are required and need to be controlled with high accuracy. However, if an attempt is made to provide variable power amplifier control of high accuracy using variable power amplifiers of high accuracy, the circuit scale becomes large, the power consumption amount increases, and the system or the unit with the variable power amplifier becomes expensive. It may be difficult to cover a wide range of gain control while high accuracy is maintained with one variable power amplifier. Therefore, considering power consumption, portability, system (unit) costs, etc., various difficulties are involved in providing transmission power control of high accuracy by the transmission power control method in the related art.

SUMMARY OF THE INVENTION

It is therefore an object of the invention to provide a radio communication device that can provide transmission power control means for less consuming power in a simple configuration for improving accuracy of transmission power control and can be miniaturized with lower power consumption and a transmission power control method in the radio communication device.

To that end, according to the invention, there is provided a radio communication device having a transmission power control function of controlling power transmitted to a station to communicate with, the radio communication device comprising at least two variable power amplifiers, variable power amplification control means for controlling the variable power amplifiers, and switch control means for performing switch control for the operation of the variable power amplifiers in response to a target transmission power.

The radio communication device further includes transmission power detection means for detecting transmission power of the radio communication device output to the station to communicate with, and in that the switch control means compares the detected transmission power with a predetermined threshold value and switches the variable power amplifiers based on the comparison result.

Further, the switch control means finds the number of times the absolute value of the detected transmission power has changed successively in a positive or negative direction from a predetermined threshold value and switches the variable power amplifiers based on the number of times.

The radio communication device further includes transmission power control bit extraction means for extracting a transmission power control bit sent from the station to communicate with from a reception signal, and transmission power theoretical value update means for updating a theoretical value of transmission power of the radio communication device based on the transmission power control bit, in that the switch control means compares the theoretical value of the transmission power with a predetermined threshold value and switches the variable power amplifiers based on the comparison result.

Further, the switch control means finds the number of times the absolute value of the theoretical value of the transmission power has changed successively in a positive or negative direction from a predetermined threshold value and switches the variable power amplifiers based on the number of times.

The radio communication further includes transmission power detection means for detecting transmission power of the radio communication device output to the station to communicate with, in that the variable power amplification control means finds an increment or decrement for each control step of the detected transmission power and changes a controlled variable of the variable power amplifier in response to the magnitude of the increment or decrement.

The radio communication device further includes transmission power control bit extraction means for extracting a transmission power control bit sent from the station to communicate with from a reception signal, in that the variable power amplification control means determines a sign representing power increment or decrement set in the transmission power control bit and changes a controlled variable of the variable power amplifier in response to a sign change of the transmission power control bit.

According to the invention, there is provided a transmission power control method in a radio communication device for controlling power transmitted to a station to communicate with, the transmission power control method comprising a step of providing at least two variable power amplifiers, a variable power amplification control step of controlling the variable power amplifiers, and a switch control step of performing switch control for the operation of the variable power amplifiers in response to a target transmission power.

The transmission power control method further comprises the transmission power detection step of detecting transmission power of the radio communication device output to the station to communicate with, in that the switch control step compares the detected transmission power with a predetermined threshold value and switches the variable power amplifiers based on the comparison result.

Further, the switch control step finds the number of times the absolute value of the detected transmission power has changed successively in a positive or negative direction from a predetermined threshold value and switches the variable power amplifiers based on the number of times.

The transmission power control method further comprises the transmission power control bit extraction step of extracting a transmission power control bit sent from the station to communicate with from a reception signal, and the transmission power theoretical value update step of updating a theoretical value of transmission power of the radio communication device based on the transmission power control bit, in that the switch control step compares the theoretical value of the transmission power with a predetermined threshold value and switches the variable power amplifiers based on the comparison result.

The switch control step finds the number of times the absolute value of the theoretical value of the transmission power has changed successively in a positive or negative direction from a predetermined threshold value and switches the variable power amplifiers based on the number of times.

The transmission power control method further comprises the transmission power detection step of detecting transmission power of the radio communication device output to the station to communicate with, in that the variable power amplification control step finds an increment or decrement for each control step of the detected transmission power and changes a controlled variable of the variable power amplifier in response to the magnitude of the increment or decrement.

The transmission power control method further comprises the transmission power control bit extraction step of extracting a transmission power control bit sent from the station to communicate with from a reception signal, in that the variable power amplification control step determines a sign representing power increment or decrement set in the transmission power control bit and changes a controlled variable of the variable power amplifier in response to a sign change of the transmission power control bit.

In the radio communication device and the transmission power control method of the invention described above, switch control is performed for the operation of the variable power amplifiers in response to the target transmission power for controlling power transmitted to the station to communicate with. At this time, the variable power amplifiers are switched for operation in response to the transmission power, so that a wide accuracy in the simple configuration; the transmission power control accuracy can be improved, the operation of the variable power amplifier can be turned off for lower power consumption, and the unit can be miniaturized.

Further, in the radio communication device and the transmission power control method, the detected transmission power of the radio communication device or the theoretical value of the transmission power based on the transmission power control bit is compared with the predetermined threshold value and the variable power amplifiers are switched based on the comparison result. For example, switch control can be performed in response to the comparison result with one threshold value or more than one threshold value is provided and switch control can also be performed so as to prolong the time period over which the variable power amplifier operation is stopped, whereby power consumption can be reduced while the transmission power control is held accurate.

Furthermore, in the radio communication device and the transmission power control method, the number of times the absolute value of the detected transmission power of the radio communication device or the absolute value of the theoretical value of the transmission power based on the transmission power control bit has changed successively in the positive or negative direction from the predetermined threshold value is found and the variable power amplifiers are switched based on the number of times, whereby the time period over which the variable power amplifier operation is stopped can be prolonged, so that power consumption can be reduced while the transmission power control is held accurate.

Moreover, in the radio communication and the transmission power control method, the controlled variable of the variable power amplifier is changed in response to the magnitude of the increment or decrement for each control step of the detected transmission power or the sign change of the transmission power control bit representing power increment or decrement, whereby the error relative to the target transmission power can be reduced and the transmission power control accuracy can be improved for providing highly accurate transmission power.

DETAILED DESCRIPTION OF THE PREFERRED EMBODIMENTS

Referring now to the accompanying drawings, there is shown a preferred embodiment of the invention.

Figure 1:
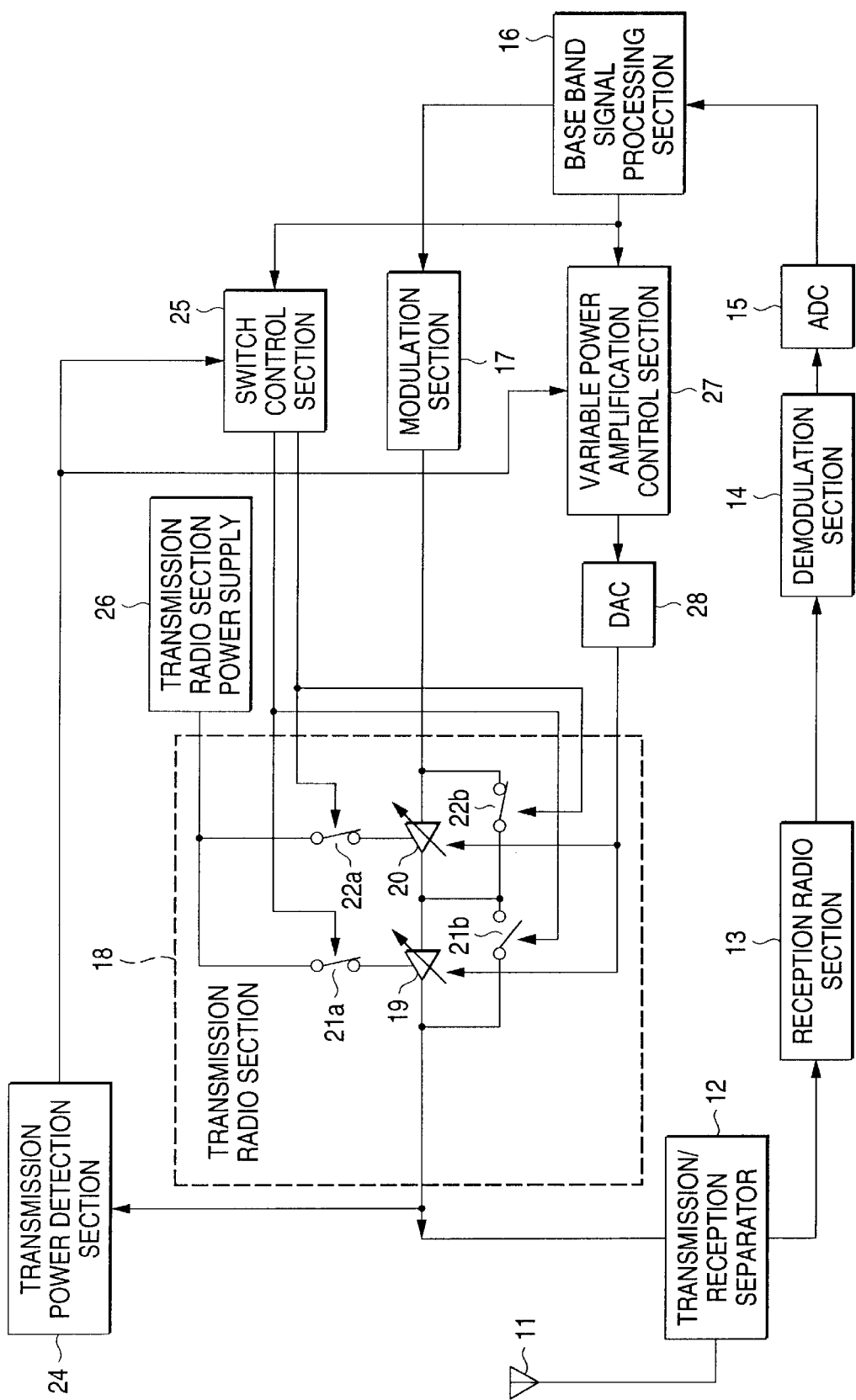
FIG. 1 is a block diagram to show the configuration of the main part of a radio communication device according to one embodiment of the invention.
Figure 2:
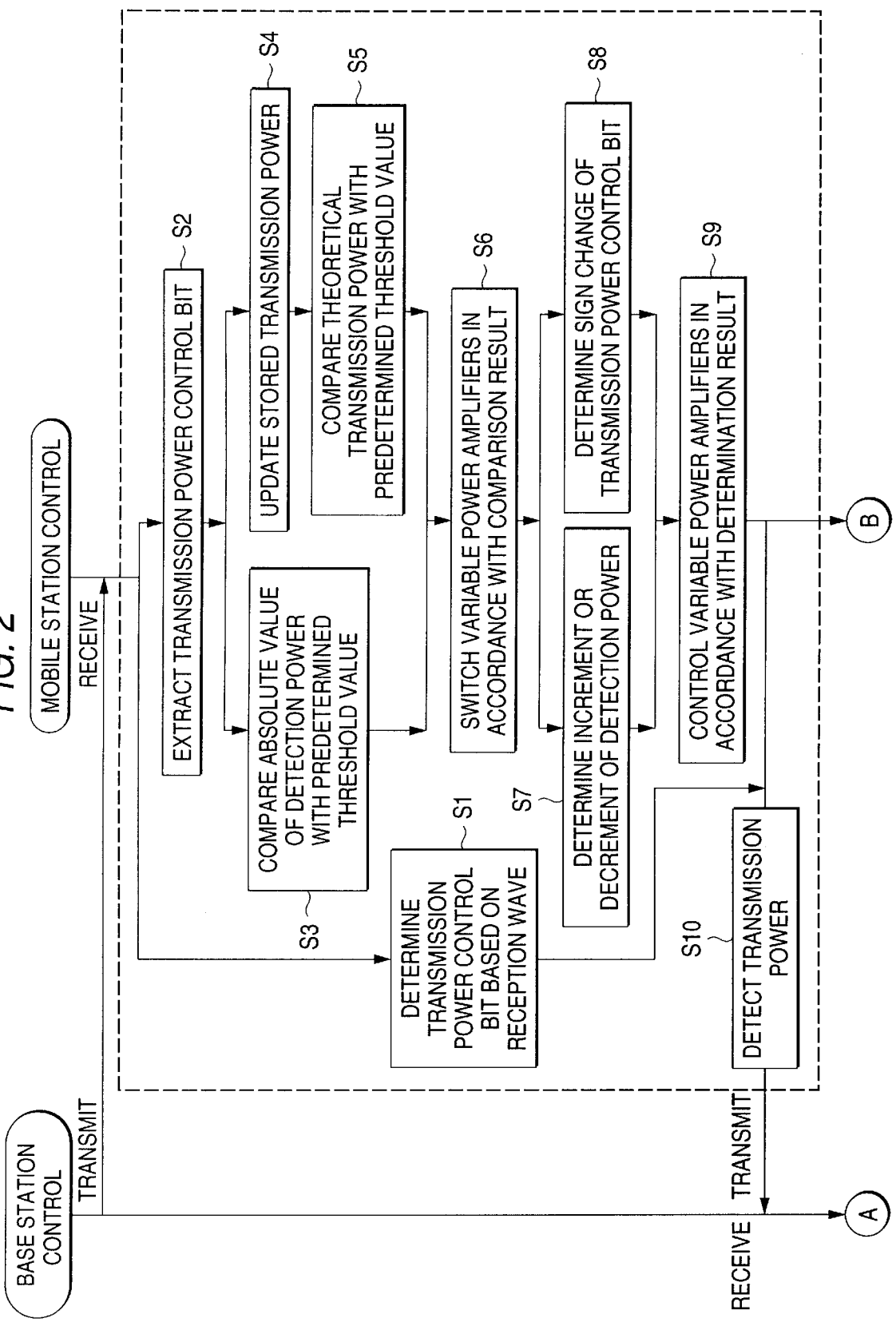
FIG. 2 is a flowchart to show the sequence of a transmission power control method according to the embodiment of the invention.
Figure 3:
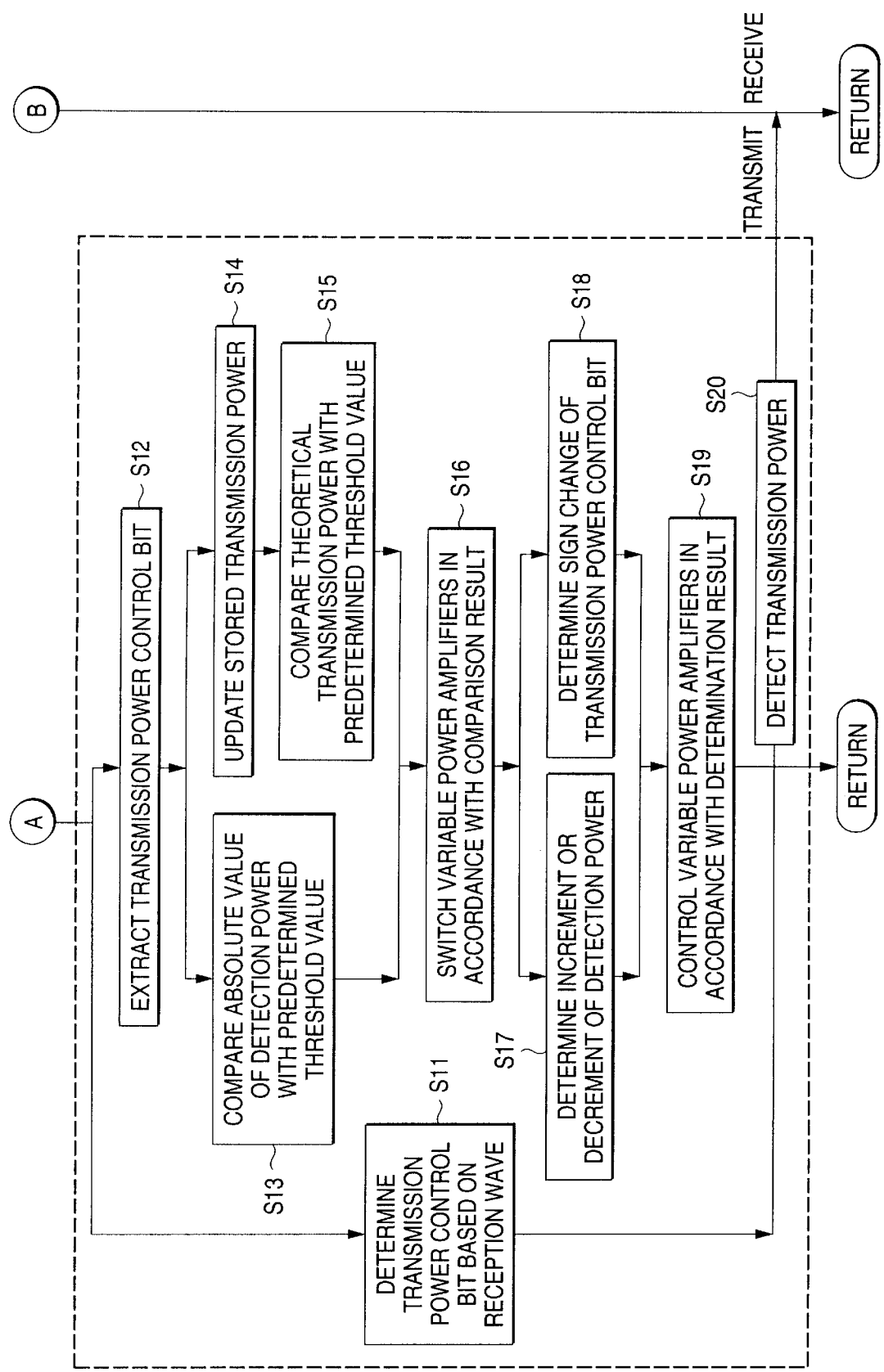
FIG. 3 is a flowchart to show the sequence of the transmission power control method according to the embodiment of the invention.

FIG. 1 is a block diagram to show the configuration of the main part of a radio communication device according to one embodiment of the invention. FIGS. 2 and 3 are flowcharts to show the sequence of a transmission power control method according to the embodiment of the invention.

A radio communication device of the embodiment is installed in, for example, a mobile communication equipment, etc., forming a base station or a mobile station in a cellular communication system for power amplifying a signal containing transmission information and transmitting the power-amplified signal to a party to communicate with. A transmission power control method described here is fitted particularly to cases where it is necessary to perform transmission power control of high accuracy with high linearity held in a wide power control range, such as mobile communication equipment of the CDMA system, etc. However, the embodiment can be applied not only to the mobile communication equipment, but also to other radio communication devices requiring similar transmission power control.

The radio communication device of the embodiment has an antenna 11 for transmitting and receiving radio signals, a transmission/reception separator 12 for separating transmission and reception signals, and a reception block consisting of a reception radio section 13 for converting the frequency of a reception signal into an IF band (intermediate frequency band), a demodulation section 14 for converting a reception signal into a base band signal, an analog-digital converter (ADC) 15 for converting an analog signal into a digital signal, and a base band signal processing section 16 for performing signal processing, decoding, etc., of a received base band signal.

The radio communication device further includes a transmission block consisting of the base band signal processing section 16 for performing signal processing, coding, etc., of a base band signal to be transmitted, a modulation section 17 for converting the frequency of a transmission signal into an IF band, and a transmission radio section 18 for performing power amplification of a transmission signal, frequency conversion of a transmission signal to an RF band (radio frequency band), etc. The transmission radio section 18 is provided with a first variable power amplifier 19 and a second variable power amplifier 20 as a plurality of variable power amplifiers, first switches 21a and 21b for turning on and off the first variable power amplifier 19, and second switches 22a and 22b for turning on and off the second variable power amplifier 20.

The radio communication device further includes a transmission power control block consisting of the base band signal processing section 16, the first and second variable power amplifiers 19 and 20, the first and second switches 21a, 21b, 22a, and 22b, a transmission power detection section 24 as transmission power detection means for detecting transmission power of the radio communication device emitted from the antenna 11, a switch control section 25 as switch control means for performing switch control of the switches 21a, 21b, 22a, and 22b, a transmission radio section power supply 26 for supplying power to the first and second variable power amplifiers 19 and 20, a variable power amplification control section 27 as variable power amplification control means for performing gain control of the first and second variable power amplifier 19 and 20, and a digital-analog converter (DAC) 28 for converting a digital signal into an analog signal. The base band signal processing section 16 has functions of transmission power control bit extraction means and transmission power theoretical value update means.

The first and second variable power amplifiers 19 and 20 are provided for varying an amplification gain covering the range of about 70 dB in total, for example. The first variable power amplifier 19 can vary the gain in the range of 30 dB and the second variable power amplifier 20 can vary the gain in the range of 40 dB, for example. The number of variable power amplifiers is not limited to two and three or more variable power amplifiers may be provided.

In the embodiment, the first and second variable power amplifiers 19 and 20 are controlled on and off in response to the values of a transmission power control bit for power control added to a transmission signal or detected transmission power of the radio communication device, which will be hereinafter referred to as detection power. More particularly, if the transmission power control bit or the transmission power value represented by detection power becomes a value indicating a predetermined condition, for example, reaches a predetermined threshold value and then changes three times successively in a positive or negative direction, either of the first and second variable power amplifiers 19 and 20 is turned off.

If the unit shown in FIG. 1 is installed in a mobile station, the base band signal processing section 16 determines a transmission power control bit based on the reception power of a reception wave (desired wave) from a base station and inserts the transmission power control bit into a transmission signal. The transmission signal has its frequency converted into the IF band by the modulation section 17 and further has the frequency converted into the RF band by the transmission radio section 18, then is transmitted via the transmission/reception separator 12 through the antenna 11 to the base station. Also, the transmission signal is detected by the transmission power detection section 24 and detection power is sent to the switch control section 25 and the variable power amplification control section 27 as a digital signal.

On the other hand, a signal transmitted from the base station is received at the antenna 11 and is input via the transmission/reception separator 12 to the reception radio section 13. The reception signal has its frequency converted into the IF band by the reception radio section 13 and is converted into a base band signal by the demodulation section 14, then the base band signal is converted into a digital signal by the analog-digital converter 15 and the digital signal is input to the base band signal processing section 16.

The base band signal processing section 16 extracts a transmission power control bit from the digital signal input from the analog-digital converter 15. The transmission power control bit is sent to the switch control section 25 and the variable power amplification control section 27. The switch control section 25 updates the theoretical value of transmission power stored in the home station, which will be hereinafter referred to as "theoretical transmission power," as indicated in the transmission power control bit. It compares the absolute value of the theoretical transmission power or the absolute value of the detection power detected by the transmission power detection section 24 with a predetermined threshold value previously stored and switches on and off the operation of the first variable power amplifier 19 and the second variable power amplifier in response to the comparison result (greater-than or less-than relation).

FIG. 1 shows that the first variable power amplifier 19 is on and the second variable power amplifier 20 is off. Since the first variable power amplifier 19 is on, the first switches 21a and 21b turn on the circuit to which power is supplied from the transmission radio section power supply 26 (the switch 21a is closed) and turn off a bypass circuit (the switch 21b is open). On the other hand, since the second variable power amplifier 20 is off, the second switches 22a and 22b turn off the circuit to which power is supplied from the transmission radio section power supply 26 (the switch 22a is open) and turn on the bypass circuit (the switch 22b is closed).

On the other hand, the variable power amplification control section 27 outputs a controlled variable corresponding to the transmission power control bit and sends the controlled variable through the digital-analog converter 28 to the first and second variable power amplifiers 19 and 20, thereby performing gain control of the variable power amplifier which is on for controlling transmission power output from the antenna 11.

In the embodiment, the two variable power amplifiers are provided for performing gain control while covering a wide range, enabling transmission power control of high accuracy. At this time, either of the two variable power amplifiers is turned off in one gain range based on a predetermined condition in response to the transmission power control bit value or the transmission power value represented by detection power, whereby the time period over which the variable power amplifier is off can be extended, and when the variable power amplifier is off, power supply can be stopped, so that power consumption can be reduced. Therefore, the duration of the battery can be prolonged and the standby time and the conversation time can be extended. Transmission power adjustment responsive to distance change between the units such as a base station and the mobile station and responsive to variation in the ambient environment, etc., can be made with high accuracy over a wide range by switching the two variable power amplifiers.

Next, the sequence of the transmission power control method according to the embodiment will be discussed in more detail with reference to FIGS. 2 and 3. For a base station and a mobile station to communicate with each other, the mobile station determines a transmission power control bit based on the reception power of a reception wave (desired wave) from the base station at step S1 in FIG. 2, inserts the transmission power control bit into a transmission signal, and transmits the resultant signal to the base station. On the other hand, the base station receives the signal transmitted from the mobile station, extracts the transmission power control bit from the reception signal at step S12 in FIG. 3 (transmission power control bit extraction step), and updates the transmission power stored in the base station (theoretical transmission power) as indicated in the transmission power control bit at step S14 (transmission power theoretical value update step). The base station detects transmission power of the base station (detection power) at step S20.

Next, the base station compares the absolute value of the theoretical transmission power with a predetermined threshold value at step S15 or compares the absolute value of the detection power with a predetermined threshold value at step S13 and switches the variable power amplifier in response to the comparison result (greater-than or less-than relation) at step S16 (switch control step).

At step S16, after the absolute value of the theoretical transmission power or the detection power reaches the threshold value, the base station counts the number of times the value has changed in the positive or negative direction successively. The base station predicts the sign change direction of the transmission power control bit from the count and switches on and off the operation of the two or more variable power amplifiers provided in the transmission power control block. At this time, let the successive number of change times in the positive direction to turn on some of the variable power amplifiers be m, the successive number of change times in the negative direction to turn off be n, and m be greater than n (m>n).

Figure 4:
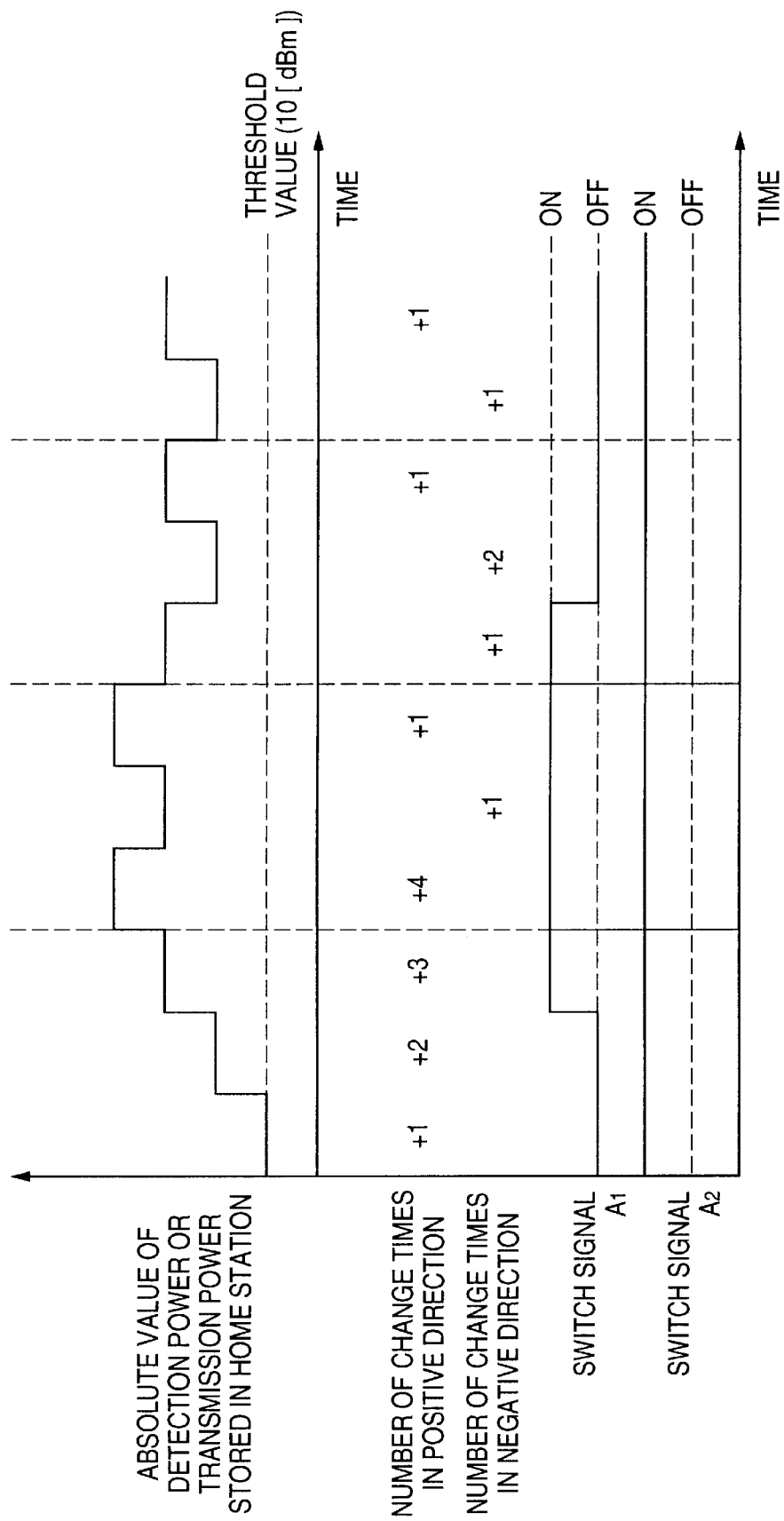
FIG. 4 is a timing chart to show an example of the switch control operation of variable power amplifiers.

FIG. 4 is a timing chart to show the operation with m=3 and n=2 as an example of the switch control operation of the variable power amplifiers. In this example, the threshold value is set to 10 (dBm). A switch signal A1 is output for performing a switch control in such a manner that if the absolute value of the theoretical transmission power or the detection power is less than the threshold value, one variable power amplifier is turned off, that if the absolute value reaches the threshold value and then changes three times successively in the positive direction, the variable power amplifier which is off is turned on, and that if the absolute value changes twice successively in the negative direction, the variable power amplifier which is on is turned off.

The variable power amplifier switch control is thus performed, whereby the time period over which the variable power amplifier is off can be extended and the power supply time period can be shortened, so that power consumption can be reduced. In comparison, a switch signal A2 is a switch signal applied to use a general control method for performing transmission power control with the variable power amplifier remaining on under the condition in FIG. 4; to use the switch signal A1, the off time period can be prolonged and power consumption can be reduced.

As a modified example of the variable power amplifier switch control operation described above, the following method can also be used: Two threshold values for variable power amplifier switch are provided and when the theoretical transmission power or the detection power increases and exceeds the first threshold value, a variable power amplifier is turned on and in the on state, when the theoretical transmission power or the detection power decreases and falls below the second threshold value, the variable power amplifier is turned off. At this time, if the first threshold value is set less than the second threshold value, the time period over which the variable power amplifier is on can be shortened and power consumption can be reduced.

Referring again to FIG. 3, then the base station determines the increment or decrement of the absolute value of the detection power at step S17 or determines sign change of the transmission power control bit at step S18, adjusts the controlled variable per control step of the variable power amplifier in accordance with the determination result, and varies the gain based on the transmission power control bit for controlling the transmission power at step S19 (variable power amplification control step). At this time, the base station detects the output transmission power of the station at step S20 (transmission power detection step).

Figure 5:
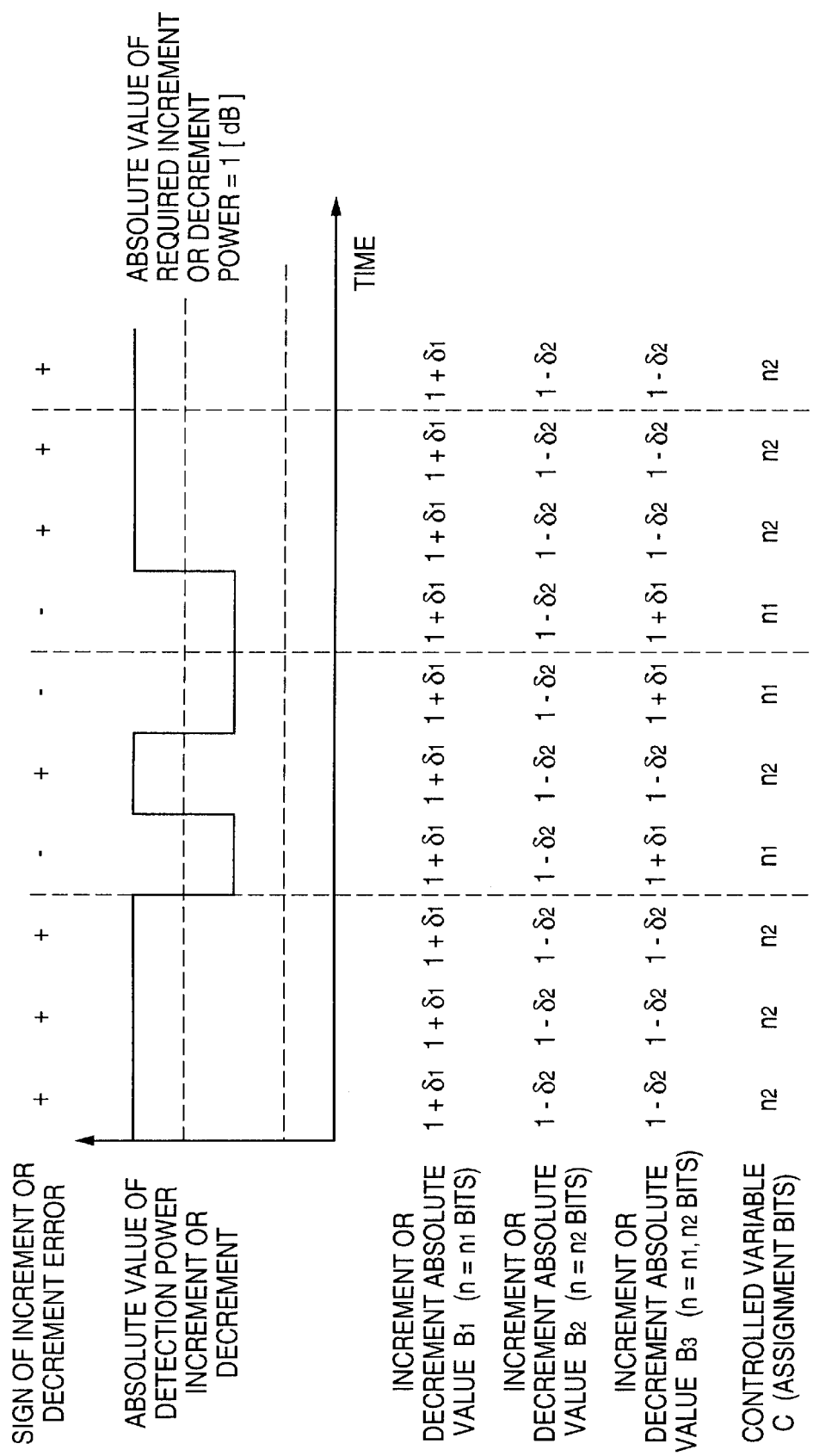
FIG. 5 is a timing chart to show the operation for changing the controlled variable of the variable power amplifier in response to the increment or decrement of detection power as a first example of the controlled variable adjustment operation in the embodiment of the invention.

FIG. 5 is a timing chart to show the operation for changing the controlled variable of the variable power amplifier in response to the increment or decrement of detection power as a first example of the controlled variable adjustment operation. In the example, the determination result of the increment or decrement of the detection power at step S17 is used.

In the first example, if the increment or decrement of the detection power is greater than the increment or decrement power amount required per control step, which will be hereinafter referred to as "required increment or decrement power," the controlled variable of the variable power amplifier is decreased; whereas if the increment or decrement of the detection power is less than the required increment or decrement power, the controlled variable of the variable power amplifier is incremented. According to the control method, an error relative to the target transmission power can be reduced and the transmission power control accuracy can be improved as compared with a general method for fixing the controlled variable of the variable power amplifier.

It is rare that for the digital theoretical value specified to change the transmission power as much as the required increment or decrement power, the actually obtained analog increment or decrement completely matches the required increment or decrement power; generally, an increment or decrement error occurs for the required increment or decrement power. If an attempt is made to adjust the increment or decrement so that it approaches the required increment or decrement power as much as possible, an analog quantity obtained corresponding to a discrete digital value takes a discrete value and thus becomes either a value a little exceeding the required increment or decrement power, which will be hereinafter referred to as "upper approximate value," or a value a little falling below the required increment or decrement power, which will be hereinafter referred to as "lower approximate value."

In the example in FIG. 5, the absolute value of the required increment or decrement power is 1 (dB), the absolute value of the upper approximate value of the required increment or decrement power is $|1+\delta 1|$ (dB), the absolute value of the lower approximate value of the required increment or decrement power is $|1-\delta 2|$ (dB), the number of bits of the DAC to give the controlled variable (digital value) corresponding to the upper approximate value (assignment bits), n, is n1, and the number of bits of the DAC to give the controlled variable corresponding to the lower approximate value, n, is n2. The radio communication device adopting the CDMA system usually uses transmission power control for changing power 1 (dB) at a time per control step, in which case the required increment or decrement power becomes 1 (dB).

In this case, in the embodiment, the increment or decrement of the detection power is adjusted as indicated in increment or decrement absolute value B3 in FIG. 5 in response to the greater-than or less-than relation of the increment or decrement of the detection power to the required increment or decrement power, namely, in response to the increment or decrement error sign. Specifically, if the increment or decrement is greater than the required increment or decrement power (the error sign is plus), controlled variable C (assignment bits) is set to n2 bits and the increment or decrement absolute value is set to 1−δ2; if the increment or decrement is less than the required increment or decrement power (the error sign is minus), the controlled variable C (assignment bits) is set to n1 bits and the increment or decrement absolute value is set to 1+δ1. In comparison, increment or decrement absolute value B1 means the increment or decrement of the detection power for each control step when n is always set to n1 bits, and increment or decrement absolute value B2 means the increment or decrement of the detection power for each control step when n is always set to n2 bits.

The increment or decrement is thus adjusted so as to cancel the detection power error, whereby the error relative to the target transmission power is decreased, so that the transmission power control accuracy can be improved.

Figure 6:
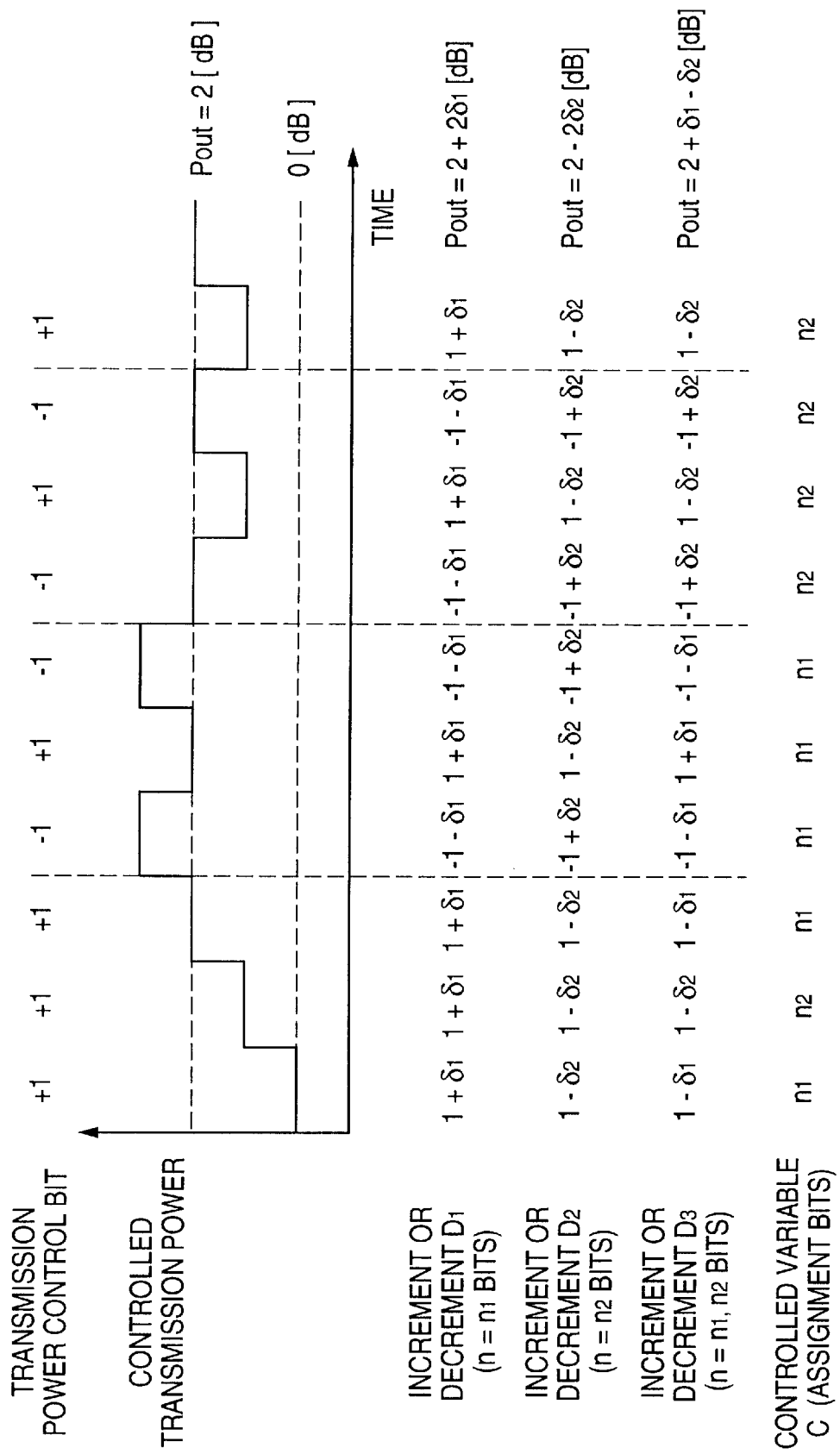
FIG. 6 is a timing chart to show the operation for changing the controlled variable of the variable power amplifier in response to a sign change of a transmission power control bit as a second example of the controlled variable adjustment operation in the embodiment of the invention (a control example for repeatedly increasing or decreasing the transmission power)
Figure 7:
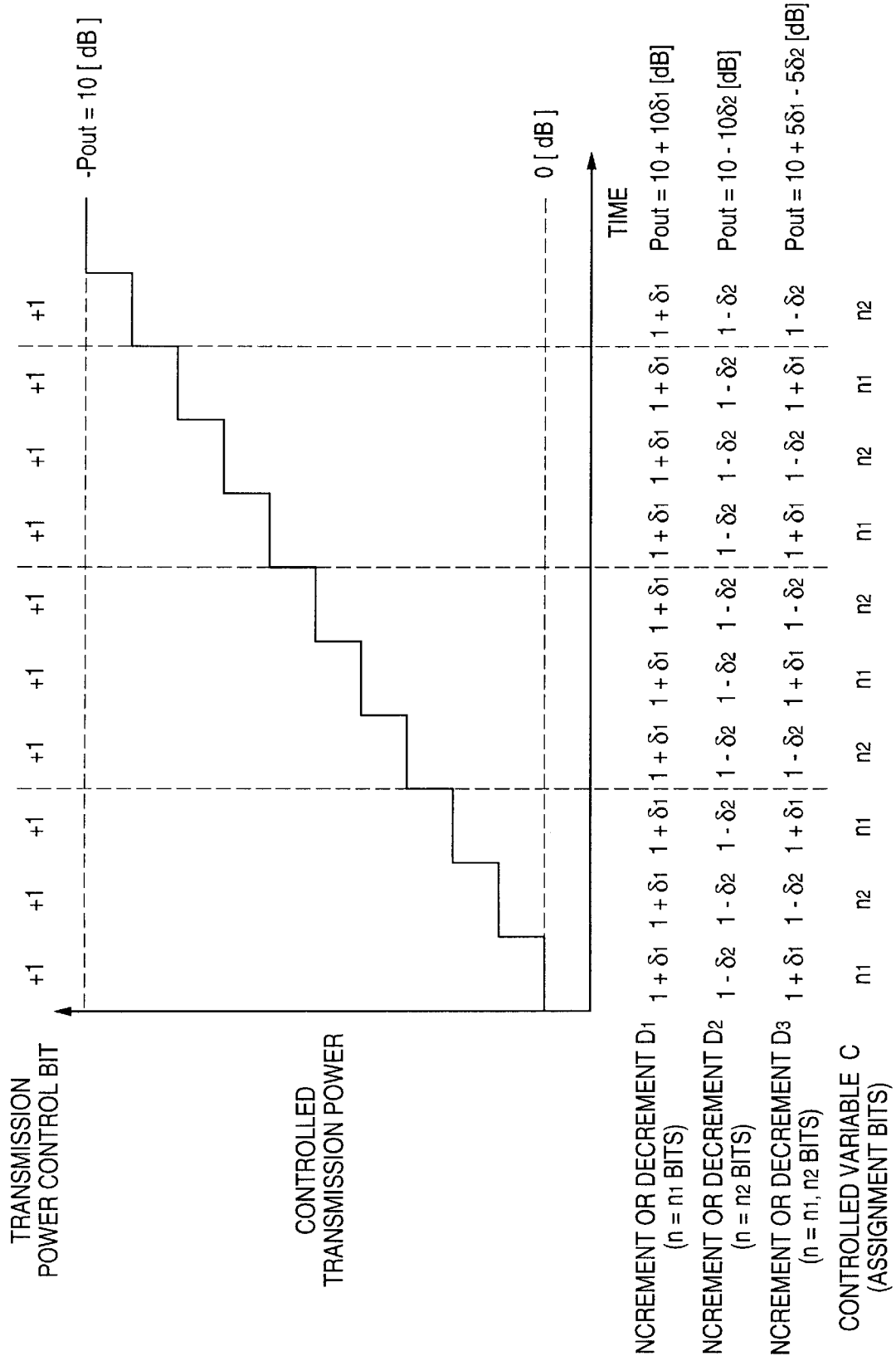
FIG. 7 is a timing chart to show the operation for changing the controlled variable of the variable power amplifier in response to a sign change of the transmission power control bit as a second example of the controlled variable adjustment operation in the embodiment of the invention (a control example for monotonously increasing or decreasing the transmission power)
Figure 8:
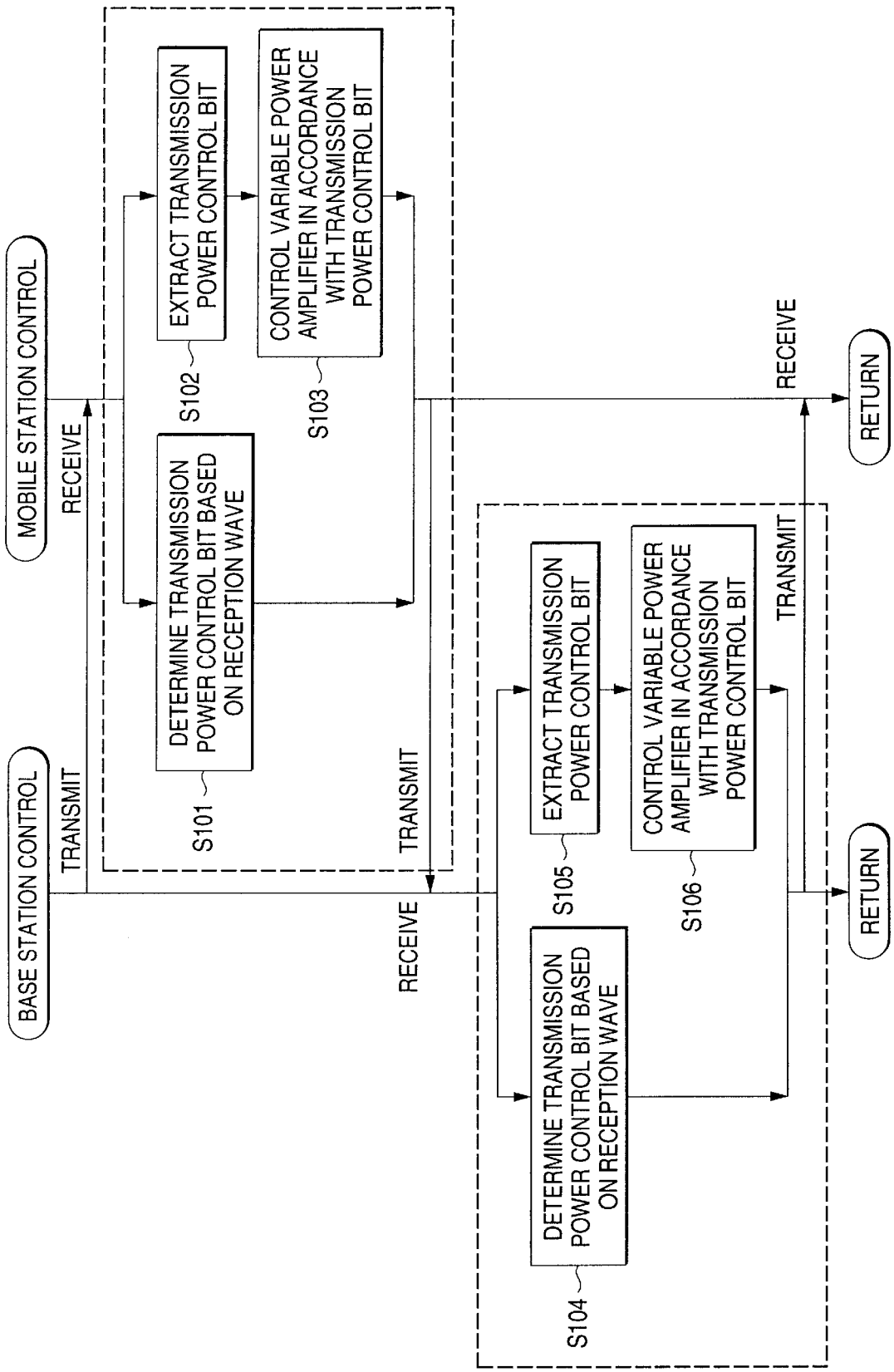
FIG. 8 is a flowchart to show an example of a transmission power control method in a related art.

FIGS. 6 and 7 are timing charts to show the operation for changing the controlled variable of the variable power amplifier in response to sign change of the transmission power control bit as a second example of the controlled variable adjustment operation. In the example, the determination result of sign change of the transmission power control bit at step S18 is used. The transmission power control bit is a control indication bit taking a value of "+1" or "−1." When the bit takes the value "+1," it represents power increment; when the bit takes the value "−1," it represents power decrement.

In the second example, if the sign of the transmission power control bit does not change, the controlled variable of the variable power amplifier is changed so that the controlled variable to give the upper approximate value of the required increment or decrement power and the controlled variable to give the lower approximate value of the required increment or decrement power are switched alternately; whereas if the sign of the transmission power control bit changes, the controlled variable of the variable power amplifier is not changed. According to the control method, error accumulation relative to the target transmission power can be reduced and the transmission power control accuracy can be improved as compared with a general method for fixing the controlled variable of the variable power amplifier.

In the examples in FIGS. 6 and 7 like the example in FIG. 5, the absolute value of the required increment or decrement power is 1 (dB), the absolute value of the upper approximate value of the required increment or decrement power is $|1+\delta 1|$ (dB), the absolute value of the lower approximate value of the required increment or decrement power is $|1-\delta 2|$ (dB), the number of bits of the DAC to give the controlled variable (digital value) corresponding to the upper approximate value (assignment bits), n, is n1, and the number of bits of the DAC to give the controlled variable corresponding to the lower approximate value, n, is n2. FIG. 6 shows a control example for repeatedly incrementing or decrementing the transmission power and FIG. 7 shows a control example for monotonously incrementing or decrementing the transmission power.

In this case, in the embodiment, the increment or decrement of the transmission power is adjusted as indicated in increment or decrement D3 in FIGS. 6 and 7 in response to sign change of the transmission power control bit. Specifically, if sign of the transmission power control bit does not change, the controlled variable C (assignment bits) is switched to n1 and n2 alternately for changing the increment or decrement absolute value to 1+δ1 or 1−δ1 as vibration; if sign of the transmission power control bit changes, the controlled variable C remains unchanged so as not to change the increment or decrement absolute value. In comparison, increment or decrement D1 means the increment or decrement of the detection power for each control step when n is always set to n1 bits, and increment or decrement D2 means the increment or decrement of the detection power for each control step when n is always set to n2 bits.

Pout at the right of FIGS. 6 and 7 denotes the value of transmission power obtained at the time at the right end when the initial value is set to 0 (dB), and becomes the sum total of the transmission power control bit or the controlled variable. As seen in the Pout, if the increment or decrement D1 or D2 is used, increment or decrement errors in the control steps are accumulated, but if the increment or decrement D3 is used, increment or decrement errors are added and subtracted and are not accumulated, so that the transmission power control accuracy can be improved.

The operation when the above-described control variable adjustment operation is performed in the configuration in FIG. 1 will be discussed. The variable power amplification control section 27 determines the increment or decrement width of the absolute value of the detection power detected by the transmission power detection section 24 or a sign change of the transmission power control bit sent from the base band signal processing section 16. It changes the assignment bits to the digital-analog converter 28 for changing the controlled variable sent to the first variable power amplifier 19 and the second variable power amplifier 20, whereby the increment or decrement of the detection power when transmission power is controlled by controlling gain control of the variable power amplifier is adjusted and the error relative to the target transmission power can be decreased, so that the transmission power control accuracy can be improved.

Referring again to FIG. 3, like the mobile station, the base station determines a transmission power control bit based on the reception power of a reception wave (desired wave) from the mobile station at step S11, inserts the transmission power control bit into a transmission signal, and transmits the resultant signal to the mobile station. On the other hand, the mobile station receives the signal transmitted from the base station, extracts the transmission power control bit from the reception signal at step S2 in FIG. 2, and updates the transmission power stored in the mobile station (theoretical transmission power) as indicated in the transmission power control bit at step S4. Next, the mobile station compares the absolute value of the theoretical transmission power with a predetermined threshold value at step S5 or compares the absolute value of the detection power with a predetermined threshold value at step S3 and switches the variable power amplifier in response to the comparison result (greater-than or less-than relation) at step S6.

Step 6 is similar to S16. The variable power amplifier switch control at step S6 is performed, whereby the time period over which the variable power amplifier is off can be extended and the power supply time period can be shortened, so that power consumption can be reduced also in the mobile station like the base station.

Next, the mobile station determines the increment or decrement of the absolute value of the detection power at step S7 or determines sign change of the transmission power control bit at step S8, adjusts the controlled variable per control step of the variable power amplifier in accordance with the determination result, and varies the gain based on the transmission power control bit for controlling the transmission power at step S9. At this time, the mobile station detects the output transmission power of the station at step S10.

Step 9 is similar to S19. The controlled variable of the variable power amplifier is adjusted at step S9, whereby the detection power increment or decrement error can be decreased, so that the detection power error relative to the target transmission power can be reduced and the transmission power control accuracy can be improved for providing highly accurate transmission power also in the mobile station like the base station.

As described above, in the embodiment, two or more variable power amplifiers are provided and variable power amplifier switch control is performed based on the number of times the absolute value of the theoretical value of the transmission power based on the detected transmission power or the transmission power control bit has changed successively in the positive or negative direction from the predetermined threshold value, whereby the time period over which the variable power amplifier is off can be extended and if the variable power amplifier is off, power supply thereto can be stopped, thus lower power consumption can be intended. The error relative to the target transmission power can be reduced in the simple configuration by adjusting the controlled variable of the variable power amplifier and the unit can be miniaturized and the transmission power control accuracy can be improved.

As described above, according to the invention, switch control is performed for the operation of at least two variable power amplifiers in response to the target transmission power for controlling power transmitted to the station to communicate with. Thus, there can be provided the radio communication device that can provide the transmission power control means for less consuming power in the simple configuration for improving the transmission power control accuracy and can be miniaturized with lower power consumption and the transmission power control method in the radio communication device.

The detected transmission power of the radio communication device or the theoretical value of the transmission power based on the transmission power control bit is compared with the predetermined threshold value and the variable power amplifiers are switched based on the comparison result, and more particularly, the number of times the absolute value of the detected transmission power of the radio communication device or the absolute value of the theoretical value of the transmission power based on the transmission power control bit has changed successively in the positive or negative direction from the predetermined threshold value is found and the variable power amplifiers are switched based on the number of times, whereby the time period over which the variable power amplifier operation is stopped can be prolonged, so that power consumption can be reduced while the transmission power control is held accurate.

The controlled variable of the variable power amplifier is changed in response to the magnitude of the increment or decrement for each control step of the detected transmission power or the sign change of the transmission power control bit representing power increment or decrement, whereby the error relative to the target transmission power can be reduced and the transmission power control accuracy can be improved for providing highly accurate transmission power.

What is claimed is:

1. A radio communication device having a transmission power control function of controlling power transmitted to a station to communicate with, said radio communication device comprising:
    at least two variable power amplifiers for amplifying an RF signal;
    transmission power detection means for detecting a transmission power of said radio communication device output to the station to communicate with;
    variable power amplification control means for controlling the gain of said variable power amplifiers;
    switch control means for performing switch control for the operation of said variable power amplifiers in response to a target transmission power, said switch control means including the capability to turn off and bypass at least one of said variable power amplifiers while allowing another of said power amplifiers to amplify said RF signal;
    transmission power control bit extraction means for extracting a transmission power control bit sent from the station to communication with from a reception signal; and
    transmission power theoretical value update means for updating a theoretical value of transmission power of said radio communication device based on the transmission power control bit;
    wherein said switch control means compares the theoretical value of the transmission power with a predetermined threshold value and switches said variable power amplifiers based on the comparison result.

2. The radio communication device as claimed in claim 1 wherein said switch control means finds the number of times the absolute value of the theoretical value of the transmission power has changed successively in a positive or negative direction from a predetermined threshold value and switches said variable power amplifiers based on the number of times.

3. A transmission power control method in a radio communication device for controlling power transmitted to a station to communicate with, said transmission power control method comprising:
    a step of providing at least two variable power amplifiers for amplifying an RF signal;
    a variable power amplifier amplification control step of controlling the gain of said variable power amplifiers;
    a switch control step of performing switch control for the operation of said variable power amplifiers in response to a target transmission power, said switch control including the steps of turning off and bypassing at least one of said variable power amplifiers while amplifying said RF signal with another of said power amplifiers;
    a transmission power control bit extraction step of extracting a transmission power control bit sent from the station to communicate with from a reception signal; and
    a transmission power theoretical value update step of updating a theoretical value of transmission power of said radio communication device based on the transmission power control bit;
    wherein said switch control step compares the theoretical value of the transmission power with a predetermined threshold value and switches said variable power amplifiers based on the comparison result.

4. The transmission power control method as claimed in claim 3, wherein said switch control step finds the number of times the absolute value of the theoretical value of the transmission power has changed successively in a positive or negative direction from a predetermined threshold value and switches said variable power amplifiers based on the number of times.

5. A transmission power control method in a radio communication device for controlling power transmitted to a station to communicate with, said transmission power control method comprising:
    a step of providing at least two variable power amplifiers for amplifying an RF signal;
    a variable power amplifier amplification control step of controlling the gain of said variable power amplifiers;
    a transmission power detection step of detecting transmission power of said radio communication device output to the station to communicate with; and
    a switch control step of comparing the detected transmission power with a predetermined threshold value, said switch control step also performing switch control for the operation of said variable power amplifiers in response to a target transmission power, said switch control including the further step of turning off and bypassing at least one of said variable power amplifiers while amplifying said RF signal with another of said power amplifiers, wherein said switch control step compares the detected transmission power with a predetermined threshold value and switches said variable power amplifiers based on the comparison result.

6. The transmission power control method as claimed in claim 5 further comprising a transmission power control bit extraction step of extracting a transmission power control bit sent from the station to communicate with from a reception signal;
    wherein said variable power amplification control step determines a sign representing power increment or decrement set in the transmission power control bit and changes a controlled variable of said variable power amplifier in response to a sign change of the transmission power control bit.

7. The transmission power control method as claimed in claim 5, wherein said switch control step finds the number of times the absolute value of the detected transmission power has changed successively in a positive or negative direction from a predetermined threshold value and switches said variable power amplifiers based on the number of times.

8. The transmission power control method of claim 5, wherein said switch control step controls at least two switches interconnected in parallel with said variable power amplifiers.

9. A transmission power control method in a radio communication device for controlling power transmitted to a station to communicate with, said transmission power control method comprising:
    a step of providing at least two variable power amplifiers for amplifying an RF signal;
    a variable power amplifier amplification control step of controlling the gain of said variable power amplifiers;
    a switch control step of performing switch control for the operation of said variable power amplifiers in response to a target transmission power, said switch control including the steps of turning off and bypassing at least one of said variable power amplifiers while amplifying said RF signal with another of said power amplifiers; and a transmission power detection step of detecting transmission power of said radio communication device output to the station to communicate with; wherein said variable power amplification control step finds an increment or decrement of the detected transmission power for each control step and changes a controlled variable of said variable power amplifier in response to the magnitude of the increment or decrement.

10. A radio communication device having a transmission power control function of controlling power transmitted to a station to communicate with, said radio communication device comprising:

at least two variable power amplifiers for amplifying an RF signal;

transmission power detection means for detecting a transmission power of said radio communication device output to the station to communicate with;

variable power amplification control means for controlling the gain of said variable power amplifiers;

switch control means for performing switch control for the operation of said variable power amplifiers in response to a target transmission power, said switch control means including the capability to turn off and bypass at least one of said variable power amplifiers while allowing another of said power amplifiers to amplify said RF signal; and transmission power detection means for detecting transmission power of said radio communication device output to the station to communicate with;

wherein said variable power amplification control means finds an increment or decrement of the detected transmission power for each control step and changes a controlled variable of said variable power amplifier in response to the magnitude of the increment or decrement.

11. A radio communication device having a transmission power control function of controlling power transmitted to a station to communicate with, said radio communication device comprising:

at least two variable power amplifiers for amplifying an RF signal;

transmission power detection means for detecting a transmission power of said radio communication device output to the station to communicate with;

variable power amplification control means for controlling the gain of said variable power amplifiers; and switch control means for comparing the detected transmission power with a predetermined threshold value, said switch control means also for performing switch control for the operation of said variable power amplifiers in response to a target transmission power, said switch control means including the capability to turn off and bypass at least one of said variable power amplifiers while allowing another of said power amplifiers to amplify said RF signal; wherein said switch control means switches said variable power amplifiers based on the comparison result.

12. The radio communication device as claimed in claim 1 further including transmission power control bit extraction means for extracting a transmission power control bit sent from the station to communicate with from a reception signal;

wherein said variable power amplification control means determines a sign representing power increment or decrement set in the transmission power control bit and changes a controlled variable of said variable power amplifier in response to a sign change of the transmission power control bit.

13. The radio communication device as claimed in claim 11, wherein said switch control means finds the number of times the absolute value of the detected transmission power has changed successively in a positive or negative direction from a predetermined threshold value and switches said variable power amplifiers based on the number of times.

14. The radio communication device of claim 1, wherein said switch control means includes at least two switches interconnected in parallel with said variable power amplifiers.

* * * * *

UNITED STATES PATENT AND TRADEMARK OFFICE
CERTIFICATE OF CORRECTION

PATENT NO. : 6,532,357 B1
DATED : March 11, 2003
INVENTOR(S) : Ichikawa

It is certified that error appears in the above-identified patent and that said Letters Patent is hereby corrected as shown below:

<u>Title page,</u>
Item [30], Foreign Application Priority Data, please delete "Aug. 7, 1999" and insert therefor -- Aug. 7, 1998 --.

<u>Column 4,</u>
Line 12, after "wide", please insert -- range of transmission power control can be performed with high --.

<u>Column 15,</u>
Line 15, please delete "tranmission power detection means for detecting a transmission power of said radio communication device output to the station to communicate with;", first occurrence <u>Column 16,</u>
Lines 20 and 35, please delete "1", and insert therefore -- 11 --.

Signed and Sealed this

Fourth Day of November, 2003

JAMES E. ROGAN
*Director of the United States Patent and Trademark Office*